(12) United States Patent
Littrell et al.

(10) Patent No.: US 11,871,664 B1
(45) Date of Patent: Jan. 9, 2024

(54) STAGGERING OF OPENINGS IN ELECTRODES FOR CRACK MITIGATION

(71) Applicant: Qualcomm Technologies Inc., San Diego, CA (US)

(72) Inventors: Robert J. Littrell, Boston, MA (US); Karl Grosh, Boston, MA (US)

(73) Assignee: QUALCOMM Technologies, Inc., San Diego, CA (US)

(*) Notice: Subject to any disclaimer, the term of this patent is extended or adjusted under 35 U.S.C. 154(b) by 917 days.

(21) Appl. No.: 16/790,537

(22) Filed: Feb. 13, 2020

Related U.S. Application Data

(63) Continuation of application No. 14/851,560, filed on Sep. 11, 2015, now Pat. No. 10,566,517.

(60) Provisional application No. 62/049,091, filed on Sep. 11, 2014.

(51) Int. Cl.
| | |
|---|---|
| *H01L 41/083* | (2006.01) |
| *H10N 30/50* | (2023.01) |
| *B06B 1/06* | (2006.01) |
| *H01L 21/02* | (2006.01) |
| *H10N 30/87* | (2023.01) |

(52) U.S. Cl.
CPC .......... *H10N 30/508* (2023.02); *B06B 1/064* (2013.01); *H01L 21/02104* (2013.01); *H10N 30/871* (2023.02)

(58) Field of Classification Search
CPC ..... H10N 30/508; H10N 30/871; B06B 1/064
See application file for complete search history.

(56) References Cited

U.S. PATENT DOCUMENTS

| | | | |
|---|---|---|---|
| 4,456,394 A | 6/1984 | Kolm et al. | |
| 6,857,501 B1* | 2/2005 | Han | H04R 17/00 |
| | | | 29/594 |
| 8,466,606 B2 | 6/2013 | Chen et al. | |
| 8,531,088 B2 | 9/2013 | Grosh et al. | |
| 9,055,372 B2 | 6/2015 | Grosh et al. | |
| 9,386,379 B2 | 7/2016 | Sparks et al. | |
| 9,479,875 B2 | 10/2016 | Hall et al. | |
| 9,516,421 B1 | 12/2016 | Loeppert et al. | |
| 9,853,201 B2 | 12/2017 | Grosh | |
| 9,961,450 B2 | 5/2018 | Hsu et al. | |
| 10,001,391 B1 | 6/2018 | Littrell | |
| 10,170,685 B2 | 1/2019 | Grosh et al. | |
| 10,566,517 B1* | 2/2020 | Littrell | H10N 30/871 |
| 10,825,982 B1 | 11/2020 | Littrell | |
| 2009/0116662 A1 | 5/2009 | Wu | |
| 2010/0254547 A1* | 10/2010 | Grosh | B81B 3/0021 |
| | | | 381/114 |

(Continued)

OTHER PUBLICATIONS

Global Dossier search has been attached.*

*Primary Examiner* — Bryan P Gordon
(74) *Attorney, Agent, or Firm* — Polsinelli QUALCOMM Technologies, Inc.

(57) ABSTRACT

A transducer comprising: at least one piezoelectric layer; a first patterned conductive layer that is patterned with a first opening; a second patterned conductive layer that is patterned with a second opening; wherein at least one piezoelectric layer is between the first and the second patterned conductive layers in a stack; and wherein a position of the first opening is staggered relative to a position of the second opening in the stack to mitigate an occurrence of crack propagation through the layers.

20 Claims, 6 Drawing Sheets

(56) References Cited

U.S. PATENT DOCUMENTS

2011/0257532 A1* 10/2011 Sasaki .................... B06B 1/064
29/25.35
2020/0313073 A1* 10/2020 Wang ..................... H04R 17/02

* cited by examiner

80

Pattern a first electrode layer deposited on a substrate with a first opening in the first electrode layer, 82

↓

Deposit a piezoelectric layer on the patterned first electrode layer, 84

↓

Deposit a second electrode layer on the piezoelectric layer, 86

↓

Pattern the deposited second electrode layer with a second opening, with a placement of second opening in the second electrode layer being staggered relative to a placement of the first opening in the first electrode layer to mitigate a probability of a crack traversing from the first electrode layer, through the piezoelectric layer and to the second electrode layer, 88

```
┌─────────────────────────────────────┐
│ Determine a location of an axis     │
│ through the stack that represents   │
│ a substantially optimal point for   │
│ breaking the first and second       │
│ electrode layers to increase an     │
│ amount of output energy of a device │
│ comprising the stack, relative to   │
│ another amount of output energy     │
│ when the axis is at another         │
│ location, 92                        │
└─────────────────────────────────────┘
                 ↓
┌─────────────────────────────────────┐
│ Based on a grain of piezoelectric   │
│ material in the at least on         │
│ piezoelectric layer, determine a    │
│ linear traversal route of a crack   │
│ through the piezoelectric material  │
│ that occurs with a decreased amount │
│ of frequency, relative an amount of │
│ frequency of other linear traversal │
│ routes through the piezoelectric    │
│ material, 94                        │
└─────────────────────────────────────┘
                 ↓
┌─────────────────────────────────────┐
│ Determine a location of the first   │
│ opening relative to the axis by     │
│ determining a location in the first │
│ electrode layer that intersects the │
│ linear traversal route, when the    │
│ linear traversal route intersects   │
│ the axis substantially in a middle  │
│ of the axis, 96                     │
└─────────────────────────────────────┘
                 ↓
┌─────────────────────────────────────┐
│ Determine a location of the second  │
│ opening relative to the axis by     │
│ determining a location in the       │
│ second electrode layer that         │
│ intersects the linear traversal     │
│ route, when the linear traversal    │
│ route intersects the axis           │
│ substantially in the middle of the  │
│ axis, 98                            │
└─────────────────────────────────────┘
```

FIG. 5

STAGGERING OF OPENINGS IN ELECTRODES FOR CRACK MITIGATION

CLAIM OF PRIORITY

This application claims the benefit of priority under 35 U.S.C. § 120 to U.S. patent application Ser. No. 14/851,560, filed on Sep. 11, 2015, which claims the benefit of priority under 35 U.S.C. § 119(e) to provisional U.S. Patent Application No. 62/049,091, filed on Sep. 11, 2014, the entire contents of which are hereby incorporated by reference.

BACKGROUND

Micro-electro-mechanical systems (MEMS) technology has enabled the development of acoustic transducers such as microphones using silicon-wafer deposition techniques. Microphones fabricated this way are commonly referred to as MEMS microphones and can be made in various forms such as capacitive microphones or piezoelectric microphones. MEMS capacitive microphones and electret condenser microphones (ECMs) are used in consumer electronics and have an advantage over typical piezoelectric MEMS microphones in that they have historically had greater sensitivity and lower noise floors. However, each of these more ubiquitous technologies has its own disadvantages. For standard ECMs, they cannot be mounted to a printed circuit board using the typical lead-free solder processing commonly used to attach microchips to the board. MEMS capacitive microphones, which are often used in cell phones, have a backplate that is a source of noise in the microphones. MEMS capacitive microphones also have a smaller dynamic range than typical piezoelectric MEMS microphones.

SUMMARY

In some examples, a transducer comprises at least one piezoelectric layer; a first patterned conductive layer that is patterned with a first opening; a second patterned conductive layer that is patterned with a second opening; wherein at least one piezoelectric layer is between the first and the second patterned conductive layers in a stack; and wherein a position of the first opening is staggered relative to a position of the second opening in the stack to mitigate an occurrence of crack propagation through the layers.

In this example, the first and second patterned conductive layers are patterned on a moving portion of the transducer to generate more than four sensor elements on the transducer. A sensor element comprises more than sixty-percent piezoelectric material. Each of the first and second conductive layers are electrodes, wherein the first and second openings are staggered about an axis that represents a substantially optimal point for breaking the electrodes to increase an amount of output energy of the transducer. The first and second openings are staggered such that a vertical traversal between the openings is against a grain of piezoelectric material in the at least one piezoelectric layers. An angle formed by a line representing the vertical traversal and a base of a conductive layer is less than or greater than an angle at which a crack propagates through the at least one piezoelectric layer. The transducer is an acoustic transducer, a microphone or a piezoelectric MEMS transducer. Each of the first and second openings have a width of substantially six microns.

In another example, a method includes patterning a first electrode layer deposited on a substrate with a first opening in the first electrode layer; depositing a piezoelectric layer on the patterned first electrode layer; depositing a second electrode layer on the piezoelectric layer; and patterning the deposited second electrode layer with a second opening, with a placement of second opening in the second electrode layer being staggered relative to a placement of the first opening in the first electrode layer to mitigate a probability of a crack traversing from the first electrode layer, through the piezoelectric layer and to the second electrode layer. Other embodiments of this aspect include corresponding computer systems, apparatus, and computer programs recorded on one or more computer storage devices, each configured to perform the actions of the methods.

In this example, the first electrode layer, the piezoelectric layer and the second electrode layer comprise a stack, and wherein the method further comprises: determining a location of an axis through the stack that represents a substantially optimal point for breaking the first and second electrode layers to increase an amount of output energy of a device comprising the stack, relative to another amount of output energy when the axis is at another location. The actions include based on a grain of piezoelectric material in the at least on piezoelectric layer, determining a linear traversal route of a crack through the piezoelectric material that occurs with a decreased amount of frequency, relative an amount of frequency of other linear traversal routes through the piezoelectric material. The actions include determining a location of the first opening relative to the axis by determining a location in the first electrode layer that intersects the linear traversal route, when the linear traversal route intersects the axis substantially in a middle of the axis. The actions include determining a location of the second opening relative to the axis by determining a location in the second electrode layer that intersects the linear traversal route, when the linear traversal route intersects the axis substantially in the middle of the axis. An angle formed by the linear traversal route intersecting the first electrode layer at a base of the first electrode layer is less than or greater than an angle at which a crack propagates through the piezoelectric layers. The actions include fabricating a piezoelectric device by the patterning and depositing actions. The piezoelectric device comprises a piezoelectric transducer, a piezoelectric acoustic transducer, or a piezoelectric microphone.

The details of one or more implementations are set forth in the accompanying drawings and the description below. Other features, objects, and advantages will be apparent from the description, the drawings, and the claims.

BRIEF DESCRIPTION OF THE FIGURES

FIGS. 4 and 5 are flowcharts of processes for fabricating transducers with staggered openings in electrode layers.

DETAILED DESCRIPTION

Figure 1:
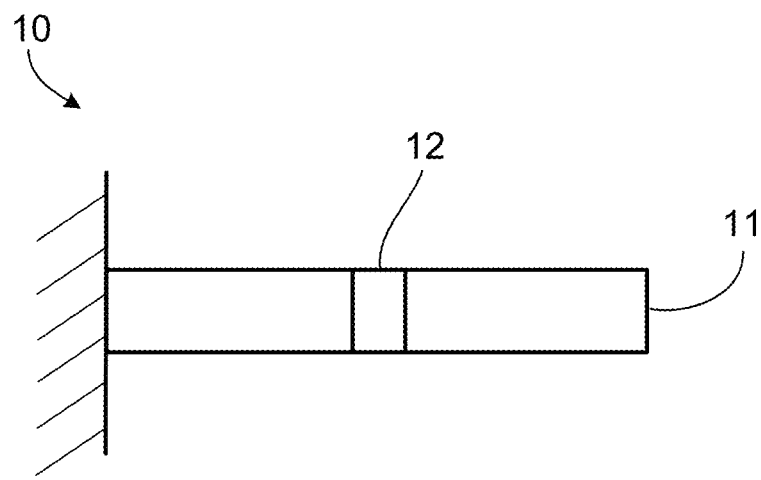
FIGS. 1-2 are each diagrams of plates.

Referring to FIG. 1, diagram 10 is a bird's eye view of beam 11 that includes a piezoelectric layer sandwiched between two electrode layers. In this example, beam 11 is included in an acoustic transducer, as described in U.S. Pat. No. 8,531,088, the entire contents of which are incorporated herein by reference. The top of beam 11 is an electrode layer with break or opening 12 in the electrode layer. Break 12 promotes optimal performance of beam 11, by preventing all the capacitance from being at the end of beam 11, where there is no sensitivity. If all the capacitance was at the end of beam 11, beam 11 would provide minimal energy. Therefore, the electrode layer is broken to have optimal performance of beam 11 and a sensor that includes beam 11. If all the breaks in the layers in beam 11 were aligned, beam 11 would be very fragile and prone to breaking. Accordingly, the breaks (or openings) are staggered to preserve the structural integrity of beam 11 and reduce breakage.

Figure 2:
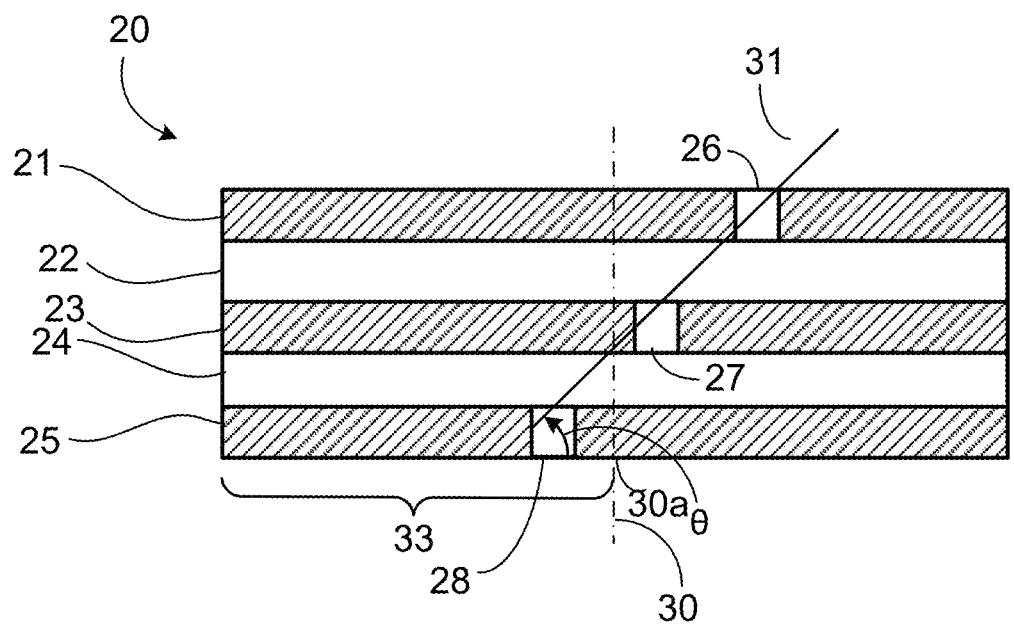

Referring to FIG. 2, an arrangement of metal patterning for crack mitigation in piezoelectric Microelectromechanical systems (MEMS) devices is shown. In this example, plate 20 (or a beam) includes electrode layers 21, 23, 25 and piezoelectric layers 22, 24. When building piezoelectric MEMS devices, the piezoelectric material is often relatively brittle and is susceptible to cracking. It is especially susceptible to cracking when a large portion of the sensor film stack (e.g., layers 21-25) includes a piezoelectric material. For example, when a sensor is built with a thin piezoelectric layer on a much thicker silicon (Si) plate, the durability of the sensor is largely determined by the durability of the thicker Si. When the sensor includes more than a predefined amount of piezoelectric material (e.g., more than 60% piezoelectric material, more than 40-70% piezoelectric material and so forth), the sensor durability is largely determined by the durability of the piezoelectric material. In the example of FIG. 2, the durability of plate 20 is substantially determined by the durability of the piezoelectric material.

When a metal layer (e.g., layer 21) covering the piezoelectric material is patterned as shown, crack initiation is reduced and likelihood of crack propagation is reduced, relative to cracking and propagation when piezoelectric material is not covered in metal. When stacking layers of patterned electrodes 21, 23, 25 and piezoelectric layers 22, 24, openings 26, 27, 28 in metal layers 21, 23, 25, respectively, are staggered so that openings are not in any vertical alignment when viewed from the upper surface of the patterned electrode. This staggering of openings 26, 27, 28 in stacks of patterned electrodes 21, 23, 25 on piezoelectric layers 22, 24 for a MEMS device greatly reduces crack propagation as a failure mechanism in such piezoelectric MEMS devices.

In this example, the metal (e.g., electrode layers 21, 23, 25) is patterned such that openings 26, 27, 28 in the metal pattern are staggered, rather than being aligned along a normal axis in the MEMS device. The metal is patterned by masking a portion of the piezoelectric material and then applying an electrode material (i.e., the metal). The mask is removed, revealing an opening (e.g., one of openings 26, 27, 28). In another example, the metal (e.g., one of electrode layers 21, 23, 25) is patterned by depositing the electrode material, masking a portion of the layer, and then removing the metal in unmasked areas, e.g., by etching away the metal in the unmasked areas.

In this example, axis 30 illustrates an optimal placement of openings in layers 21, 23, 25, e.g., to ensure optimal performance of plate 20. The location 30a of axis 30 (in the stack of layers 21-25) is determined in accordance with the optimization parameter described in U.S. Pat. No. 8,531,088, which is:

$$\text{Optimization Parameter} = \frac{V_{out}^2 C}{P^2 A \tan(\delta)} \cdot f_{res}^2$$

In this example, A is the sensor area (e.g., the area of plate 20 that is electrically connected to the rest of the transducer or base). In this example, the sensor area A, resonance frequency $f_{res}$, dissipation factor tan(d), and input pressure P are constant. The capacitance C and output voltage $V_{out}$ are determined by the locations of electrode breaks (i.e., openings) 27 and 28. As the length from the base of the plate to the electrode breaks 27 and 28 is increased, the capacitance will increase and the output voltage will decrease. As the length from the base of the plate to the electrode breaks 27 and 28 is decreased, the capacitance will decrease and the output voltage will increase. Based on this, the product of capacitance and the squared output voltage is maximized, at optimal locations of breaks 27, 28. In this example, all variables are constant except for $V_{out}$ and C. A value of the optimization parameter is determined by determining values of $V_{out}$ and C that result in an increased value for the optimization parameter, relative to other values of the optimization parameter at other values of $V_{out}$ and C. In this example, axis 30 is located at location 30a, which is a location in the stack at which a length of the sensor area A is length 33. In this example, if all the breaks are aligned with axis 30, plate 20 would be very fragile. In this example, axis 30 could be located in various portions of the stack. The particular location 30a is determined in accordance with the foregoing optimization equation, e.g., by determining an optimal location for the electrode breaks.

To promote durability of plate 20, openings 26, 27, 28 are staggered about axis 30. In this example, openings 26, 27, 28 are spread out enough to provide crack mitigation, but not spread out too far away from axis 30 that performance substantially declines. In particular, openings 26, 27, 28 are staggered in accordance with a slope of line 31 (e.g., a slope of 0.1). In this example, the slope of line 31 is predetermined in accordance with a grain of materials used in plate 20, e.g., a grain of piezoelectric material in layers 22, 24. In this example, line 31 represents a linear traversal route of a crack that is unlikely to occur, given the grain pattern of the piezoelectric material. Based on the grain, a slope (e.g., of a linear traversal route) is selected that is sufficiently against the grain that breakage is prevented. In this example, a ninety degree angle (θ) is less than ideal, because at this angle the piezoelectric material is very prone to breakage. However, if the angle is very small, the locations of the staggered breaks are less than ideal (even though breakage is very unlikely at a small angle), because this results in breaks in the electrodes that are further away from axis 30 and thus a decreased value for the optimization parameter. Accordingly, an angle is selected that is less than ninety degrees but still large enough to provide an acceptable optimization parameter (i.e., the selected value for the angle results in at least a threshold optimization parameter), e.g., based on values of $V_{out}$ and C that result from breaks with locations that are determined from the selected angle.

As shown in FIG. 2, an angle (θ) formed by the linear traversal route (e.g., line 31) intersecting a first electrode layer 25 at a base of first electrode layer 25 is less than or greater than an angle at which a crack propagates through the piezoelectric layer 24. In this example, the angle is 5.7 degrees. Because AlN has primarily 0002 orientation, the grain boundaries are primarily at 90 degrees to the substrate surface. An alignment of openings in the vertical direction, therefore, is the worst case for vertical crack propagation and smaller angles will do more to inhibit crack propagation. The best optimization parameter is achieved when openings 27 and 28 are aligned because the optimal location for an electrode break is the same for all layers. Therefore, it is desirable to find some angle at which the crack propagation is significantly inhibited but the optimization parameter is not significantly reduced. Because the optimization parameter does not vary sharply about its maximum, this allows for a relatively large design space. Therefore, we have selected a 10:1 ratio of break separation to film thickness resulting in an angle of 5.7 degrees. In this example, a piezoelectric layer has a thickness of 500 nanometers. In this example, the breaks are separated from each other by 5um, in accordance with the 10:1 ratio. The placement of openings 26, 27, 28 is determined by intersecting line 31 with axis 30, e.g., in a center of axis 30. In this example, a vertical traversal of a break (e.g., in accordance with line 31) is less likely than a vertical traversal of a break along axis 30. In this example, the width of a break (e.g., break 26) is of various lengths, including, e.g., six microns. The length of the break is determined by studying the trade-off between crack mitigation and stray capacitance. If the break is too wide, although the breaks are off-set, a vertical opening in the electrode material through the entire film stack will still result. If the break is too narrow, the plates will be coupled through fringing fields, leading to unwanted stray capacitance. Again, the design space is somewhat large and we have selected 6 um as a safe spacing to avoid significant stray capacitance. In this example, the performance of plate 20 is based on individual performance of layers 21, 22, 23, with electrode openings 26, 27, and individual performance of layers 23, 24, 25, with electrode openings 27, 28. The combination (e.g., average) of these individual performances provides a performance that is substantially the same as a performance that would be obtained by breaks or openings aligned along axis 30.

Figure 3A:
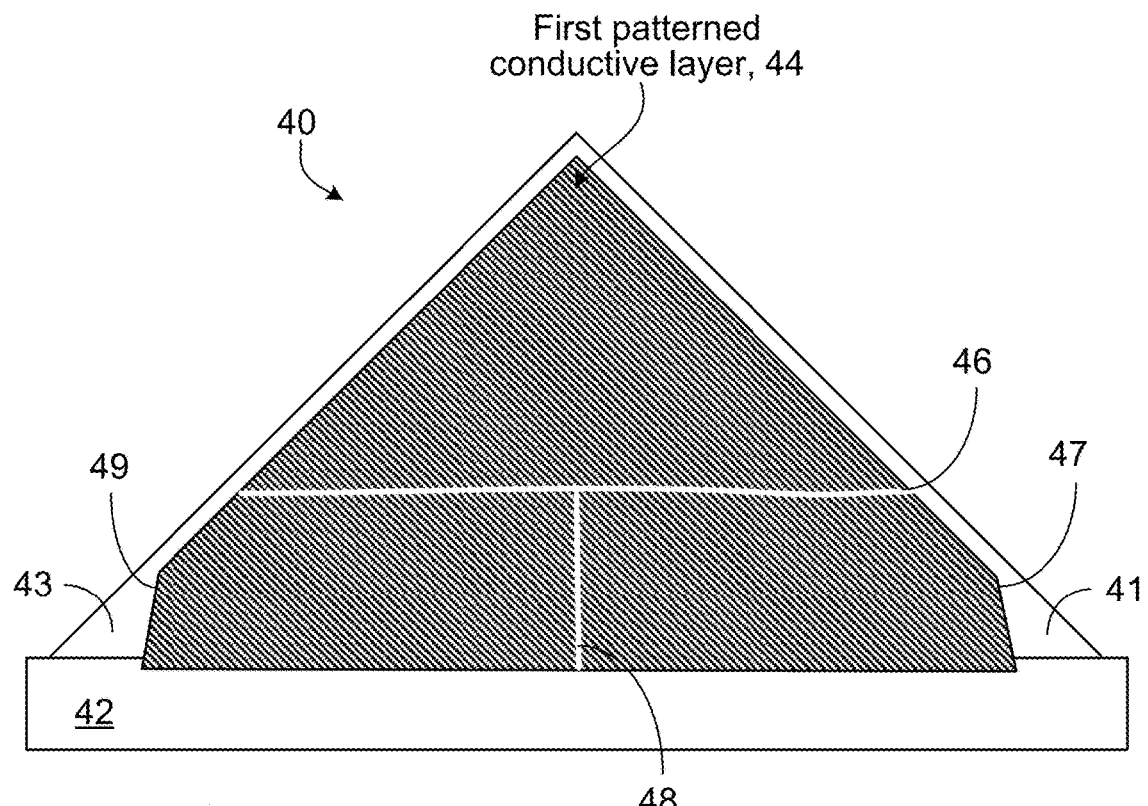
FIGS. 3A-3E are each diagrams of a piezoelectric MEMS device.
Figure 3B:
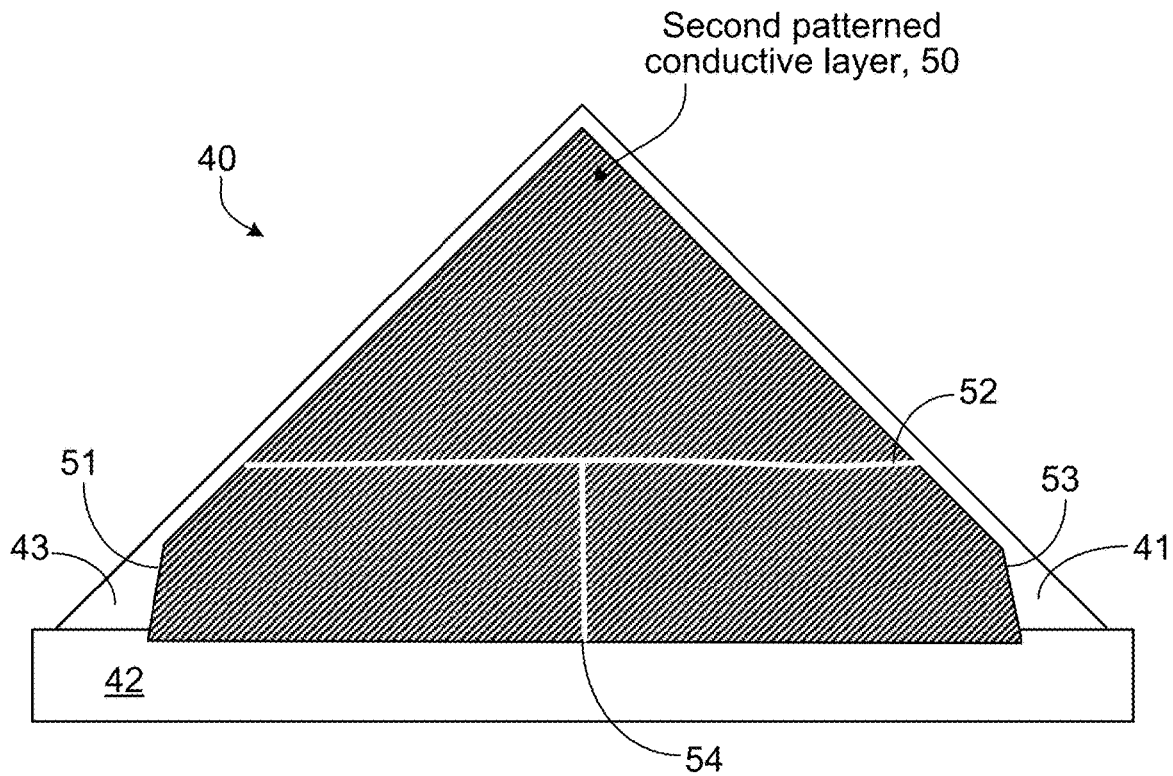
Figure 3C:
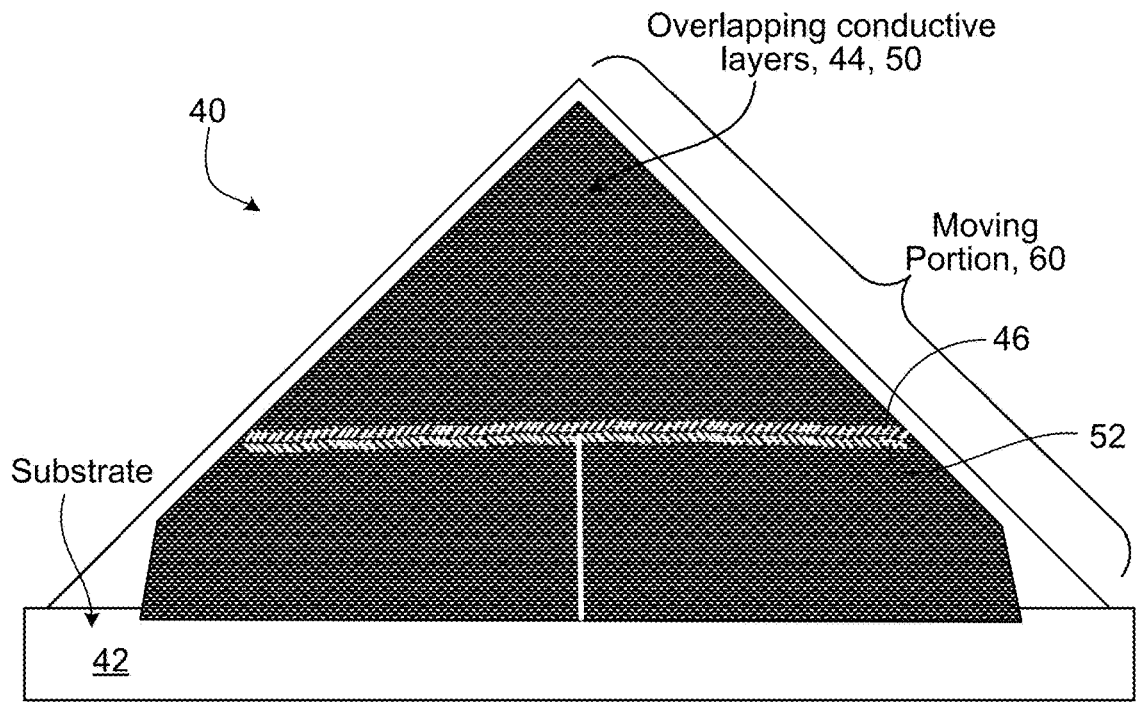

Referring to FIGS. 3A-3C, first and second patterned conductive layers are patterned on a moving portion of a piezoelectric MEMS device to generate more than four sensor elements on the piezoelectric MEMS device. These four sensor elements are included in an acoustic transducer or microphone, as described in U.S. Pat. No. 9,055,372, the entire contents of which are incorporated herein by reference.

Referring now to FIG. 3A, beam 40 is fabricated on substrate 42. FIG. 3A provides a top or bird's eye view of the beam. Beam 40 includes layer 44, which is a first patterned conductive or electrode layer. The pattern of layer 44 includes break 46 for crack mitigation and break 48 to segment an active area of the electrode layers. The active area of the electrode layers is segmented because these various active areas will later be wired in series to trade-off sensor output voltage with sensor capacitance. Layer 44 also includes breaks 47, 49, which are ending points for layer 44 and are for crack mitigation, leaving portions 41, 43 of a piezoelectric material that is sandwiched between layers 44, 50 (FIG. 3B). In this example, the middle electrode is broken over portions 41, 43, with the top and bottom electrodes being unbroken over portions 41, 43. Referring to FIG. 3B, beam 40 is built up with second layer 50, which is a second patterned conductive (or electrode) layer. Layer 50 includes breaks 51, 52, 53 for crack mitigation and break 54 to segment the active areas of the electrode. FIG. 3C illustrates the portions of the first and second patterned conductive layers 44, 50 that overlap and moving portion 60 of beam 40. Generally, a moving portion is one or more mechanical moving elements on a MEMS device. FIG. 3C provides a transparent view of the top of beam 40 to enable visualization of the various layers and breaks in beam 40. In this example, layer 44 is visually shown through break 52 in layer 50, as is shown by the thatching in FIG. 3C. Layer 50 is visually shown relative to break 46 in layer 44. In this example, breaks 46, 52 are staggered relative to each other for crack mitigation.

Based on the crack mitigation that results from staggering the breaks, a sensor has a decreased amount of fragile areas, e.g., relative to an amount of fragile area of a sensor that is produced with the breaks aligned together. Using the techniques described herein, a fragile area is less than 50% of the sensor area. In particular, all of the plate is either Area X or Area Y so it adds up to 100%. The "fragile area" is either area X or islands of Area Y that do not extend to the substrate. There are no islands of Area Y in this example. An island of Area Y would be an Area Y that is completely surrounded by Area X and does not overlap with the substrate.

Figure 3D:
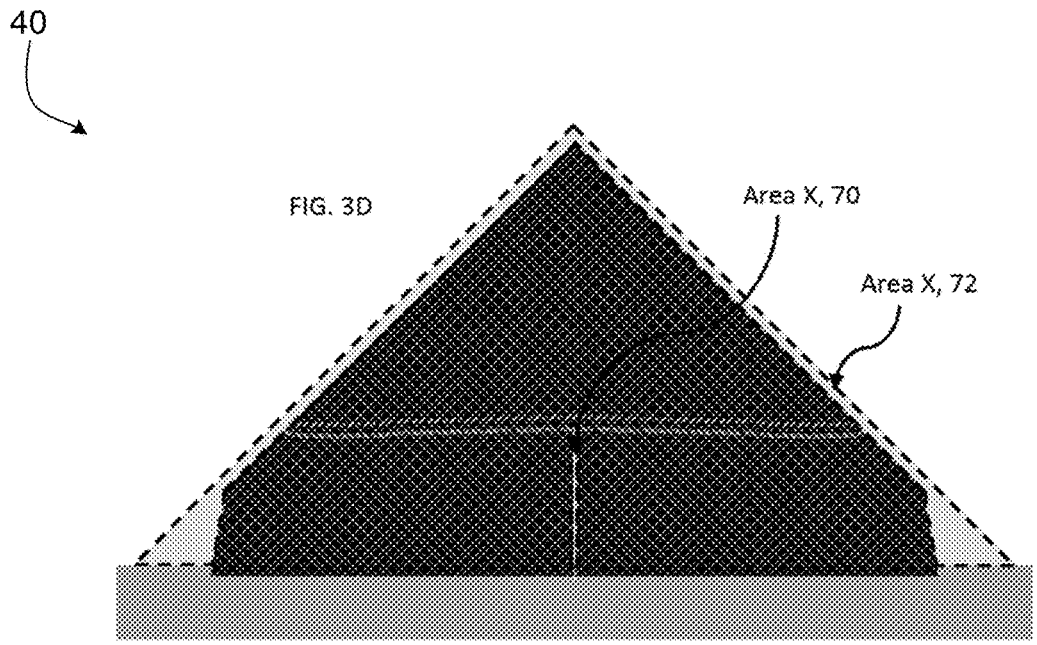
Figure 3E:
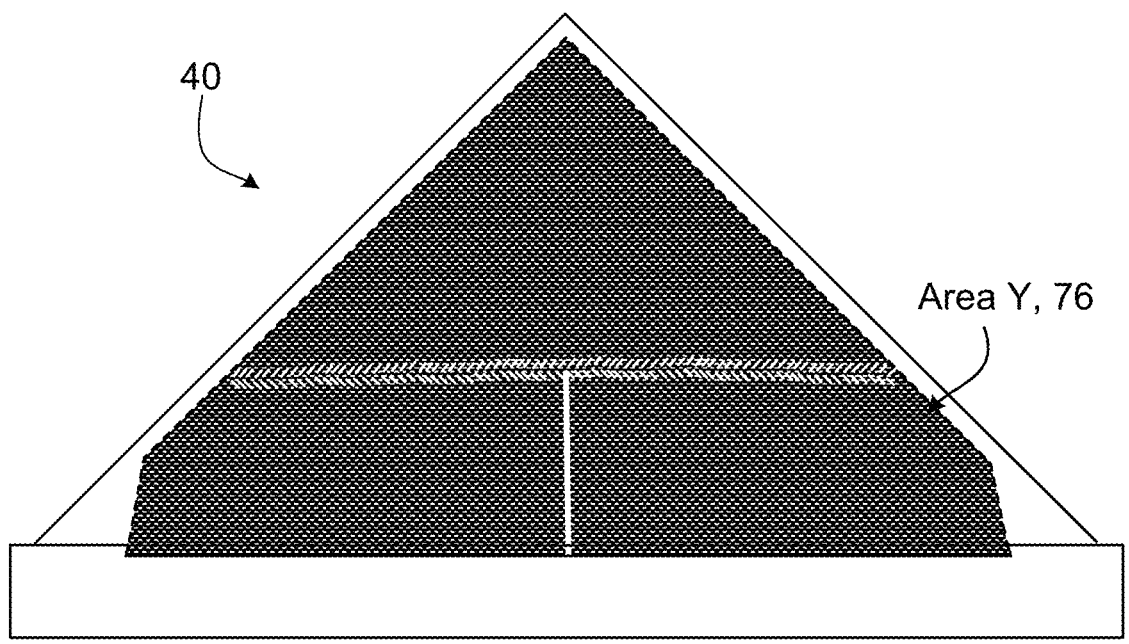

Referring to FIG. 3D, beam 40 includes areas 70, 72 (i.e., areas X), which are fragile areas. An Area X is an area on the moving portion of a piezoelectric device that includes only piezoelectric material when looking from the top-down. Referring to FIG. 3E, beam 40 includes non-fragile area 76, e.g., area Y that does extend to a substrate on which the piezoelectric MEMS device is built. An area Y is all of the areas on the moving portion of a piezoelectric device that is not Area X.

Referring to FIG. 4, process 80 is implemented (e.g., by one or more processing devices, fabrication devices, or other electronic systems) in fabricating a transducer. In operation, the device patterns (82) a first electrode layer deposited on a substrate with a first opening (e.g., opening 28) in the first electrode layer. The device deposits (84) a piezoelectric layer on the patterned first electrode layer and deposits (86) a second electrode layer on the piezoelectric layer. The device also patterns (88) the deposited second electrode layer with a second opening (e.g., opening 27), with a placement of the second opening in the second electrode layer being staggered relative to a placement of the first opening in the first electrode layer to mitigate a probability of a crack traversing from the first electrode layer, through the piezoelectric layer and to the second electrode layer.

Referring to FIG. 5, process 90 is implemented (e.g., by an electronic system or another entity) in identifying a placement of the openings in the electrode layers. In operation, the first electrode layer, the piezoelectric layer and the second electrode layer is a stack. In this example, the system or entity determines (92) a location of an axis (e.g., axis 30) through the stack that represents a substantially optimal point for breaking the first and second electrode layers to increase an amount of output energy of a device comprising the stack, relative to another amount of output energy when the axis is at another location. Based on a grain of piezoelectric material in the at least one piezoelectric layer, the system or entity determines (94) a linear traversal route (e.g., route 31) of a crack through the piezoelectric material that occurs with a decreased amount of frequency, relative an amount of frequency of other linear traversal routes through the piezoelectric material. The system or entity determines (96) a location of the first opening (e.g., opening 28) relative to the axis by determining a location in the first electrode layer that intersects the linear traversal route, when the linear traversal route intersects the axis substantially in a middle of the axis. The system or entity also determines (98) a location of the second opening (e.g., opening 27) relative to the axis by determining a location in the second electrode layer that intersects the linear traversal route, when the linear traversal route intersects the axis substantially in the middle of the axis.

Embodiments can be implemented in digital electronic circuitry, or in computer hardware, firmware, software, or in combinations thereof. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Any of the foregoing can be supplemented by, or incorporated in, ASICs (application-specific integrated circuits).

Other embodiments are within the scope and spirit of the description and the claims. For example, the techniques described herein can be applied to various types of devices, including, e.g., a (MEMS) device, an accelerometer, a transducer, an acoustic sensor, a sensor, a microphone or a gyroscope. Additionally, the techniques described herein for damping a resonance frequency may also be used to adjust a resonance frequency and to increase a resonance frequency.

Additionally, due to the nature of software, functions described above can be implemented using software, hardware, firmware, hardwiring, or combinations of any of these. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

A number of embodiments have been described. Nevertheless, it will be understood that various modifications may be made without departing from the spirit and scope of the claims and the examples of the techniques described herein.

What is claimed is:

1. A device comprising:
   a first layer with a first opening;
   a second layer with a second opening; and
   at least one layer between the first and the second layers,
   wherein a traversal between the first and second openings has an orientation that is substantially distinct from an orientation of an axis of the at least one layer.

2. The device of claim 1, wherein the at least one layer comprises at least one piezoelectric layer.

3. The device of claim 1, wherein at least one of the first layer or the second layer comprises a conductive layer.

4. The device of claim 1, wherein the axis of the at least one layer comprises an axis defined along a grain of material in the at least one layer.

5. The device of claim 1, wherein the first and second layers are patterned on a moving portion of the device to generate more than four sensor elements on the device.

6. The device of claim 1, wherein the device includes a sensor element that comprises more than sixty-percent piezoelectric material.

7. The device of claim 1, wherein each of the first and second layers are electrodes, and wherein the first and second openings are staggered about an axis that represents a substantially optimal point for breaking the electrodes to increase an amount of output energy of the device.

8. The device of claim 1, wherein an angle formed by a line representing the traversal and a base of the first or second layer is less than or greater than an angle at which a crack propagates through the at least one layer.

9. The device of claim 1, wherein the device is an acoustic transducer, a microphone or a piezoelectric MEMS transducer.

10. The device of claim 1, wherein each of the first and second openings are included in a moving portion of the device.

11. A device comprising:
    a first layer with a first opening;
    a second layer with a second opening; and
    at least one layer between the first and the second layers,
    wherein a position of the first opening is staggered relative to a position of the second opening such that a traversal between the first and second openings has an orientation that is substantially distinct from an orientation of an axis of the at least one layer to mitigate an occurrence of crack propagation through the layers.

12. The device of claim 11, wherein the at least one layer comprises at least one piezoelectric layer.

13. The device of claim 11, wherein at least one of the first layer or the second layer comprises a patterned conductive layer.

14. The device of claim 11, wherein the axis of the at least one layer comprises an axis defined along a grain of material in the at least one layer.

15. The device of claim 11, wherein the first and second layers are patterned on a moving portion of a transducer to generate more than four sensor elements on the transducer.

16. The device of claim 11, wherein the device includes a sensor element that comprises more than sixty-percent piezoelectric material.

17. The device of claim 11, wherein each of the first and second are electrodes, and wherein the first and second openings are staggered about an axis that represents a substantially optimal point for breaking the electrodes to increase an amount of output energy of the device.

18. The device of claim 11, wherein an angle formed by a line representing the traversal and a base of the first or second layer is less than or greater than an angle at which a crack propagates through the at least one layer.

19. The device of claim 11, wherein the device is a transducer, a microphone or a piezoelectric MEMS transducer.

20. The device of claim 11, wherein each of the first and second openings are included in a moving portion of the device.

* * * * *